(12) United States Patent
Breitling et al.

(10) Patent No.: US 10,384,932 B2
(45) Date of Patent: Aug. 20, 2019

(54) DEVICE INCLUDING MICROMECHANICAL COMPONENTS IN CAVITIES HAVING DIFFERENT PRESSURES AND METHOD FOR ITS MANUFACTURE

(71) Applicant: Robert Bosch GmbH, Stuttgart (DE)

(72) Inventors: Achim Breitling, Reutlingen (DE);
Jan-Peter Stadler, Pfullingen (DE);
Jochen Reinmuth, Reutlingen (DE);
Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/779,413

(22) PCT Filed: Oct. 12, 2016

(86) PCT No.: PCT/EP2016/074485
§ 371 (c)(1),
(2) Date: May 25, 2018

(87) PCT Pub. No.: WO2017/097468
PCT Pub. Date: Jun. 15, 2017

(65) Prior Publication Data
US 2018/0339900 A1    Nov. 29, 2018

(30) Foreign Application Priority Data

Dec. 8, 2015   (DE) .................. 10 2015 224 545

(51) Int. Cl.
*B81B 7/02* (2006.01)
*B81C 1/00* (2006.01)
*B81B 7/00* (2006.01)

(52) U.S. Cl.
CPC .............. *B81B 7/02* (2013.01); *B81B 7/0038* (2013.01); *B81C 1/00134* (2013.01);
(Continued)

(58) Field of Classification Search
CPC ............ B81C 1/00134; B81C 1/00182; B81C 2203/0109; B81C 2203/0118;
(Continued)

(56) References Cited

U.S. PATENT DOCUMENTS 6,470,594 B1   10/2002   Boroson et al.
7,221,033 B2   5/2007   Lutz et al.
(Continued)

FOREIGN PATENT DOCUMENTS

DE   102014202801 A1   8/2015
WO   2015/120939 A1    8/2015

OTHER PUBLICATIONS

International Search Report for PCT/EP2016/074485, dated Nov. 23, 2016.

*Primary Examiner* — Scott B Geyer
(74) *Attorney, Agent, or Firm* — Norton Rose Fulbright US LLP; Gerard Messina (57) ABSTRACT

A method for manufacturing a micromechanical component, including: providing a MEMS wafer and a cap wafer; forming micromechanical structures in the MEMS wafer for at least two sensors; hermetically sealing the MEMS wafer with the cap wafer; forming a first access hole in a first cavity of a first sensor; introducing a defined first pressure into the cavity of the first sensor via the first access hole; closing the first access hole; forming a second access hole in a second cavity of a second sensor; introducing a defined second pressure into the cavity of the second sensor via the second access hole; and closing the second access hole.

16 Claims, 6 Drawing Sheets (52) U.S. Cl.
CPC .. *B81C 1/00293* (2013.01); *B81B 2201/0235* (2013.01); *B81B 2201/0242* (2013.01); *B81C 1/00269* (2013.01); *B81C 1/00952* (2013.01); *B81C 1/00984* (2013.01); *B81C 2203/0118* (2013.01); *B81C 2203/0145* (2013.01); *B81C 2203/035* (2013.01)

(58) Field of Classification Search
CPC .......... B81C 1/00269; B81C 2203/035; B81C 1/00277; B81C 1/00285; B81C 1/00293; B81C 2203/0145; B81B 2201/0235; B81B 2201/0242; B81B 7/0038; B81B 7/0041; B81B 7/02
See application file for complete search history.

(56) References Cited

U.S. PATENT DOCUMENTS

| | | |
|---|---|---|
| 8,546,928 B2 | 10/2013 | Merz et al. |
| 2002/0051258 A1* | 5/2002 | Tamura ................ B81B 7/0041 358/514 |
| 2008/0136000 A1* | 6/2008 | Fischer ................ B81B 7/0041 257/682 |
| 2010/0028618 A1* | 2/2010 | Gonska .................... B81B 7/02 428/188 |
| 2012/0260747 A1 | 10/2012 | Chen et al. |
| 2012/0326248 A1* | 12/2012 | Daneman ................. B81B 7/02 257/415 |
| 2013/0265701 A1* | 10/2013 | Takizawa ............... H05K 5/069 361/679.01 |
| 2014/0008738 A1 | 1/2014 | Morris, III et al. |
| 2014/0306300 A1 | 10/2014 | Gunthner et al. |
| 2015/0061046 A1* | 3/2015 | Chang ....................... B81B 7/04 257/415 |
| 2015/0351246 A1* | 12/2015 | Baillin .................. H05K 1/183 361/784 |
| 2015/0353347 A1* | 12/2015 | Schelling ............. B81B 7/0041 257/414 |
| 2016/0039667 A1* | 2/2016 | Zhang ................ B71C 1/00333 438/48 |
| 2016/0244325 A1* | 8/2016 | Cheng ....................... B81B 7/02 |
| 2016/0355394 A1* | 12/2016 | Tseng ................. B81B 7/0041 |
| 2016/0368763 A1* | 12/2016 | Gonska .................... B81B 7/02 |

* cited by examiner

DEVICE INCLUDING MICROMECHANICAL COMPONENTS IN CAVITIES HAVING DIFFERENT PRESSURES AND METHOD FOR ITS MANUFACTURE

FIELD OF THE INVENTION

The present invention relates to a method for manufacturing a micromechanical component. Moreover, the present invention relates to a micromechanical component.

BACKGROUND INFORMATION

Micromechanical sensors for measuring acceleration, rotation rate, magnetic field, and pressure, for example, are known and are mass-produced for various applications in the automotive and consumer sectors. Cost-effective manufacture and miniaturization of the components are desirable, in particular in consumer electronics. In particular, an increase in the integration density (i.e., achieving greater functionality in the same installation space) of MEMS sensors is sought. For this purpose, it is increasingly common for a rotation rate sensor and an acceleration sensor to be situated on the same chip.

One of the challenges with combined rotation rate sensors and acceleration sensors lies in the different internal pressures at which the sensors are to be operated. Ideally, a rotation rate sensor is operated with a good vacuum, typically at approximately 0.1 mbar to approximately 2 mbar, while an acceleration sensor should be at least critically damped, and therefore typically operated at internal pressures above approximately 100 mbar. The simultaneous operation of a rotation rate sensor and an acceleration sensor on one chip thus suggests the provision of two separate cavity volumes, having different internal pressures, in a hermetically capped chip.

Various manufacturing methods for setting two cavities having different internal pressures are already known. An example of one suitable method is to apply a getter material in the cavity of the rotation rate sensor, as known from U.S. Pat. No. 8,546,928 B2, for example. Wafer bonding between a MEMS wafer and a cap wafer subsequently takes place at high internal pressure (suitable for the acceleration sensor). After or during the hermetic sealing, the getter is chemically activated via a temperature step and effectuates a greatly reduced internal pressure in the cavity of the rotation rate sensor.

Other methods are so-called reseal techniques, as from US 2010/0028618 A1, for example, in which after the wafer bonding (or closure with the aid of thin film capping technology), one of the cavities is opened, a suitable internal pressure is set, and the cavity is subsequently reclosed. It is possible to either initially close the cavities at low internal pressure and subsequently open the acceleration sensor cavity, provide it with high internal pressure, and subsequently close it, or, after the initial closure at high internal pressure, to open the rotation rate sensor cavity, evacuate it, and close it at low internal pressure. The closure may take place, for example, via thin film deposition, for example oxide or metal deposition, or also via a so-called laser reseal, in which a surrounding area around an access hole, close to the surface, is locally melted by localized heat input with the aid of a laser, thus closing the access hole, as from WO 2015/120939 A1, for example.

Further options for encapsulating different internal pressures are in US 2012/0326248 A1, for example.

Setting suitable internal pressures for acceleration sensors and rotation rate sensors is complicated by the fact that acceleration sensors, which generally have a significantly smaller spring stiffness than rotation rate sensors, and thus also have smaller restoring forces from the mechanical stops, require a so-called anti-stiction coating (ASC) for avoidance of "sticking" or static friction (stiction). The ASC is typically applied prior to the wafer bonding, and forms a Teflon-like monolayer on the silicon surfaces. The undesirable adhesion forces between movable structures and mechanical stops may be greatly reduced in this way. In contrast, for a rotation rate sensor, ASC is not only unnecessary due to the much greater mechanical stiffness, but is even counterproductive for setting a low cavity pressure.

Standard bonding processes such as glass frit bonding or eutectic bonding (between aluminum and germanium, for example) are typically carried out at elevated temperatures higher than 400° C. Capping a rotation rate sensor coated with ASC, using this method, is therefore problematic, since a portion of the ASC molecules have already evaporated from the silicon surfaces and increased the cavity internal pressure.

This problem may be compounded in particular when the cavity volume is very small when a completely flat cap wafer, for example a CMOS wafer with an integrated evaluation circuit, is used, and therefore the particle density of the ASC molecules in the gaseous phase is particularly high. At the same time, the anti-stick properties of the ASC layer in the cavity of the acceleration sensor may deteriorate due to the partial evaporation during the wafer bonding.

In other known closure processes, for example growth of an epitaxial thin film silicon cap, the temperature budget is so high that the deposition of ASC prior to the closure is meaningless, since the ASC molecules essentially completely degrade or evaporate at the high closure temperatures. For the case of silicon thin film capping, the subsequent filling of the sensor with ASC through an access hole and subsequent closure thereof via various deposition processes has therefore been provided, for example, in U.S. Pat. No. 7,221,033 B2.

Patent document DE 10 2014 202 801 A1 provides a method for manufacturing a micromechanical component; from a chronological standpoint, initially a joining process between the MEMS element and the cap element is carried out, and a further processing step for the micromechanical component is carried out only when the high temperature of the joining process no longer prevails. The subsequent further processing step, for example in the form of introducing a defined internal pressure into a cavity, conditioning a surface of MEMS structures, etc., may thus be advantageously carried out at a lower temperature in a more flexible and cost-effective manner.

In such methods, it is also disadvantageous that gases such as $H_2$ or light noble gases such as helium and neon may diffuse through oxide layers and other layers of the MEMS structure at moderate temperatures of approximately 150° C., which may occur in practice. The stated gases may develop during a capping process, due to a chemical reaction in this process, or may diffuse from the sensor wafer or cap wafer due to the high temperature in the capping process. A high internal pressure is set in the cavity of the acceleration sensor. Gases such as $N_2$, which do not diffuse through oxide, are typically used for this purpose. The additional gases which may develop during the capping process and diffuse through oxide constitute only a small portion compared to $N_2$.

If the H₂ gas diffuses from the acceleration sensor cavity over the service life of the sensor device, the pressure in the acceleration sensor cavity changes only slightly. Furthermore, acceleration sensors are also insensitive to small pressure changes. However, it may be critical that a portion of the H₂ may diffuse into the rotation rate sensor cavity, due to the low internal pressure prevailing there and due to the high sensitivity of the rotation rate sensor to pressure changes, which may result in failure of the rotation rate sensor.

SUMMARY OF THE INVENTION

An object of the present invention is to provide an improved micromechanical component that includes at least two sensor cavities having different internal pressures.

According to a first aspect, the present invention provides a method for manufacturing a micromechanical component, including the steps
  providing a MEMS wafer and a cap wafer;
  forming micromechanical structures in the MEMS wafer for at least two sensors;
  hermetically sealing the MEMS wafer with the cap wafer;
  forming a first access hole in a first cavity of a first sensor;
  introducing a defined first pressure into the cavity of the first sensor via the first access hole;
  closing the first access hole;
  forming a second access hole in a second cavity of a second sensor;
  introducing a defined second pressure into the cavity of the second sensor via the second access hole; and
  closing the second access hole.

Opening and closing of access holes of different sensor cavities in a sequential manner, i.e., carried out in succession, is achieved in this way. Providing different internal pressures in the sensor cavities of the micromechanical component is thus simplified. In addition, it is thus possible to carry out defined processing steps for the two sensor cavities individually.

According to a second aspect, the object is achieved with a micromechanical component that includes:
  a MEMS wafer; and
  a cap wafer;
  the MEMS wafer and the cap wafer being joined with the aid of a bond connection, at least two sensors being provided with different internal pressures;
  a different pressure having been provided in the cavities of each of the two sensors via access holes;
  the access holes in the cavities of the sensors having been opened and closed in succession.

Specific embodiments of the method are the subject matter of the dependent claims.

One advantageous refinement of the method provides that after the MEMS wafer is joined to the cap wafer, H₂-containing gas is removed from the cavity of the second sensor and a defined gas is filled into the cavity of the second sensor. This advantageously assists in removing H₂-containing gas that develops due to the temperature (approximately 450° C.) that prevails during the bonding process. As a result, the hydrogen cannot diffuse from the cavity of the second sensor (acceleration sensor) into the cavity of the first sensor (rotation rate sensor) and increase the pressure there, thereby improving the efficiency of the overall sensor.

Another advantageous refinement of the method provides that after the hydrogen is removed from the cavity of the second sensor, oxygen and/or ozone and/or a defined plasma is/are filled into the cavity of the second sensor. Different processing steps for tempering the sensor cavity, via which the sensor cavity of the second sensor may be processed in a defined manner, are provided in this way.

Another advantageous refinement of the method provides that in the case of filling multiple media, sequential filling of each medium is carried out. Defined processing of the cavity of the second sensor in multiple processing steps is thus made possible.

Another advantageous refinement of the method is characterized in that an anti-stick layer is filled into the cavity of the second sensor. It is thus advantageously made possible that the sensitive micromechanical structures do not adhere or stick to one another.

One advantageous refinement of the method provides that the closing of the MEMS wafer with the cap wafer is carried out with the aid of a wafer bonding process or with the aid of a thin film cap. Different closure techniques for the manufacturing method are thus advantageously made possible.

Another advantageous embodiment of the method provides that the formation of at least one of the access holes is carried out with the aid of a laser. Efficient, rapid, and cost-effective opening of the access holes is thus advantageously made possible.

Another advantageous refinement of the method provides that the formation of at least one of the access holes is carried out with the aid of a trenching process. An alternative method for creating the access holes is thus advantageously provided.

Another advantageous refinement of the method provides that the closing of at least one of the access holes is carried out with the aid of a laser. Efficient, cost-effective, and rapid closure of the access holes is thus facilitated.

Another advantageous refinement of the method provides that the closing of at least one of the access holes is carried out with the aid of a deposition process. An alternative closure method for the access holes is thus provided.

Further advantageous refinements of the method provide that at least one of the access holes is formed in the MEMS wafer or in the cap wafer. A large variety of manufacturing options for the micromechanical component are thus facilitated.

Another advantageous refinement of the method provides that an ASIC wafer is used as the cap wafer. In this way, an electronic circuit infrastructure, present in the ASIC wafer, for processing sensor signals may be installed in the micromechanical component. In addition, compactness of the cavities is facilitated, thus allowing a compact design of the micromechanical component.

Another advantageous refinement of the method provides that structures for a third sensor are formed in the MEMS wafer. In this way, the method is suitable for a varying number of sensors, as the result of which numerous different sensor topologies may be implemented.

The present invention is described in greater detail below with further features and advantages, with reference to multiple figures. All provided features constitute the subject matter of the present invention, regardless of their recapitulation in the patent claims, and regardless of their wording and illustration in the description and figures, respectively. Identical or functionally equivalent components have the same reference numerals. Figures in particular are intended to illustrate the principles essential to the present invention, and are not necessarily depicted true to scale.

DETAILED DESCRIPTION

Figure 1:
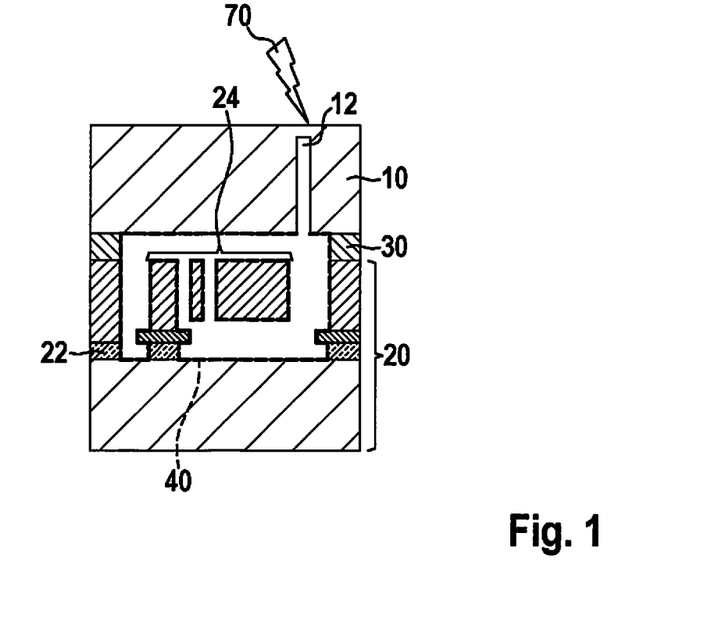
FIG. 1 shows a conventional cavity of a micromechanical component, which is closed with the aid of a laser.

FIG. 1 shows a cross-sectional view of a known system for a micromechanical component, including a cavity, the method for closing the cavity being carried out via a laser reseal process. A MEMS wafer 20 that is joined to a cap wafer 10 via a bond connection 30 is apparent. A partially movable micromechanical structure 24 is formed on MEMS wafer 20, thus forming a micromechanical sensor, for example an inertial sensor. An anti-stick layer (anti-stiction coating (ASC)) 40 is applied to a surface of micromechanical structure 24 and in the interior of the cavity, and has the function of keeping structures 24 from sticking to one another. Access hole 12 in cap wafer 10 is subsequently closed with a laser 70 by the above-described localized melting of substrate material.

The first sensor may be a rotation rate sensor, and the second sensor may be an acceleration sensor. A compact inertial sensor, in particular for the automotive or consumer electronics sectors, may advantageously be implemented in this way.

FIGS. 2 through 9 show schematic cross-sectional views of a sequence of a provided method for manufacturing a micromechanical component 100.

Figure 2:
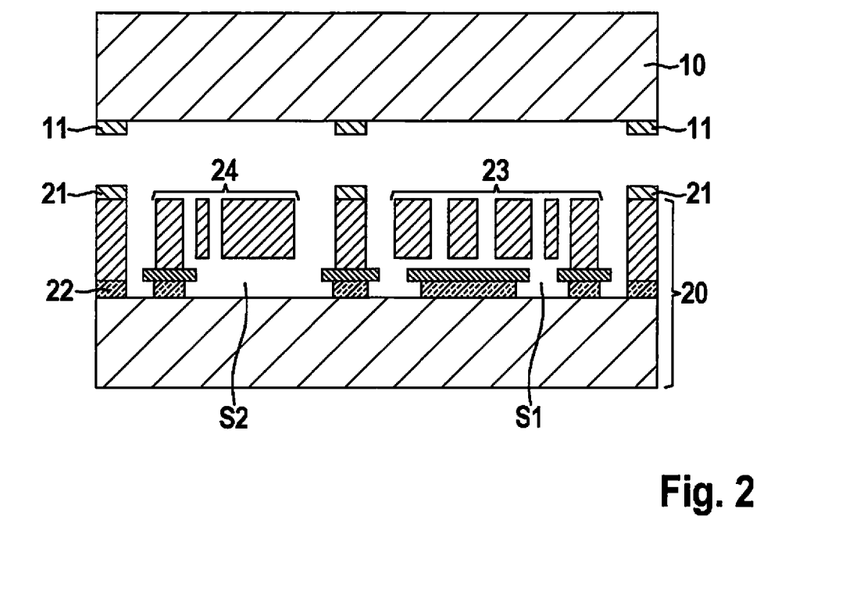
FIGS. 2 through 8 show results of method steps of the provided method for manufacturing a micromechanical component.

A cap wafer 10 and a MEMS wafer 20 are initially provided, structures 23, 24 being formed in MEMS wafer 20 and may be produced by a surface micromechanical technique. A first sensor S1 and a second sensor S2 are thus formed, it being possible for first sensor S1 to be configured as a rotation rate sensor, and second sensor S2 to be configured as an acceleration sensor.

A bonding partner 11, 21, for example in the form of aluminum and germanium, is apparent on cap wafer 10 and on substrate wafer or MEMS wafer 20, respectively. An insulation layer 22, which may be configured as an oxide material, is also apparent on MEMS wafer 20.

Figure 3:
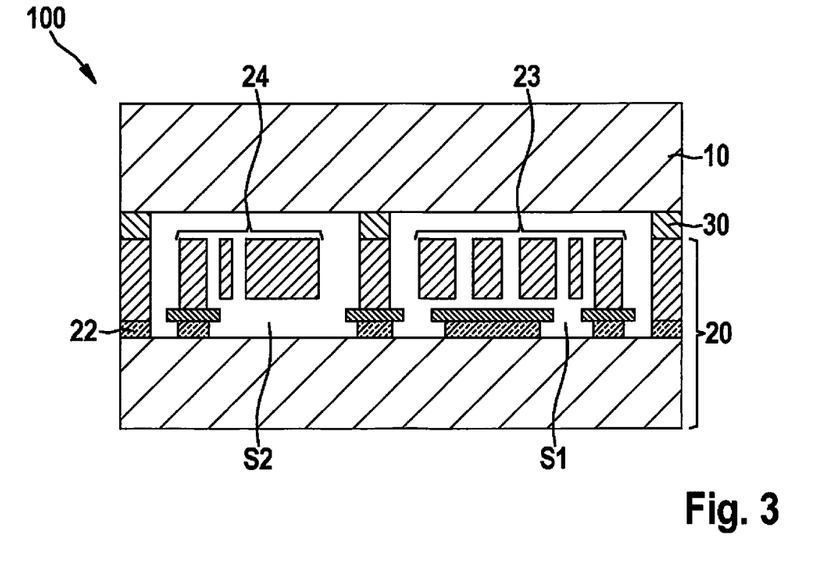

FIG. 3 shows a cross-sectional view of micromechanical component 100, with MEMS wafer 20 and cap wafer 10 joined together via bond connection 30. It is apparent that micromechanical component 100 includes two different sensors S1 and S2, each with a sensor cavity. First sensor S1 includes partially movable micromechanical structures 23, and second sensor S2 includes partially movable micromechanical structures 24.

Alternatively, MEMS wafer 20 may be closed with the aid of thin film capping (not illustrated).

Figure 4:
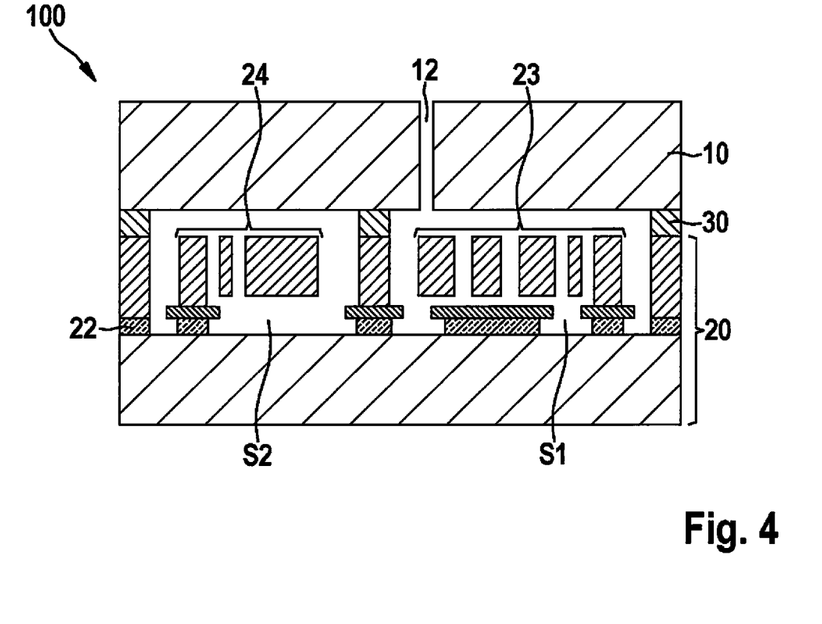

In the cross-sectional view of micromechanical component 100 in FIG. 4, it is apparent that a first access hole 12 is formed in cap wafer 10. This may take place with the aid of laser drilling, using a laser 70, or alternatively via a trenching process. The cavity of first sensor S1 is subsequently evacuated.

Figure 5:
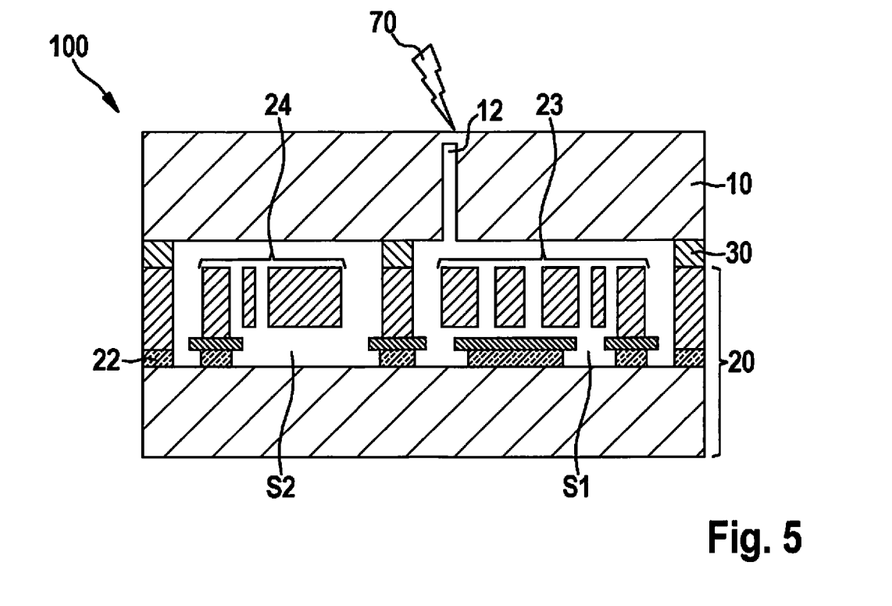

In FIG. 5 it is apparent that first access hole 12 has been closed, which may be with the aid of a laser 70 (laser reseal). Alternatively, a film deposition process may be used. The sequence of opening and closing the cavities of sensors S1 and S2 is interchangeable in principle. For cost reasons, opening with a laser 70 is the process variant instead of trenching. Likewise for cost reasons, closing access holes 12, 13 with laser 70 is the process variant instead of other closure methods. With laser closure of the acceleration sensor, the types of gas and the pressure in the cavity may be set very flexibly in a particularly advantageous manner. When a film deposition process is used, this is possible only to a limited extent, depending on the process used (for example, for closure with an oxide).

Figure 6:
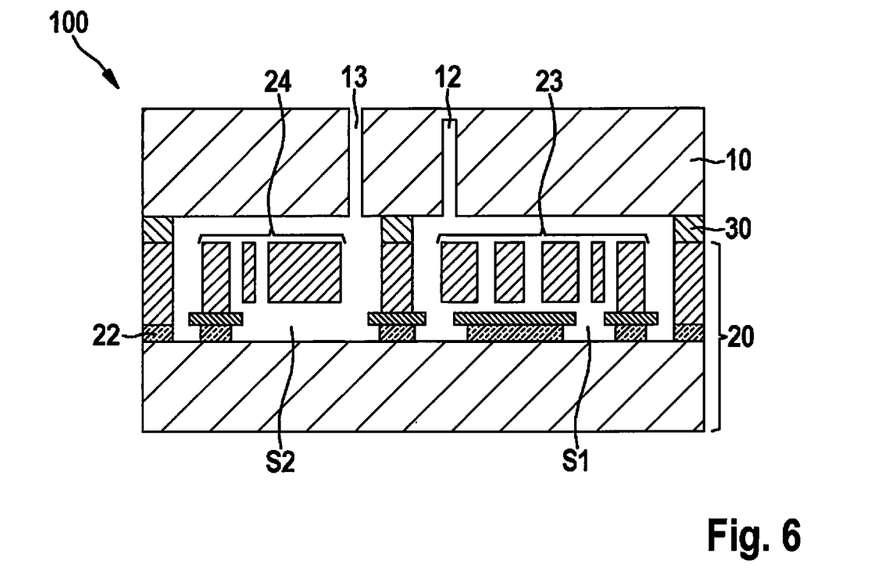

In the cross-sectional view of micromechanical component 100 in FIG. 6, it is apparent that a second access hole 13 has been formed in the cavity of second sensor S2, which may be via laser drilling, or alternatively via trenching.

$H_2$-containing gas in the cavity of second sensor S2 is now removed, and the cavity is filled with a suitable medium or gas at a suitable pressure. After this exchange of the gas in the cavity of second sensor S2, it may be advantageous to temper micromechanical component 100 for a certain period of time, with the access channel open to the cavity of second sensor S2. This may advantageously take place under a gas atmosphere via which the discharge or outward diffusion of the light gases is intentionally accelerated, or which reacts with the outwardly diffusing gas.

For this purpose, it is advantageous to use oxygen or ozone, for example. In addition to pure gases, radicals or ions may also be used with the aid of a plasma treatment. It is also advantageous for the stated media to be able to partially penetrate into the surface of the MEMS element in order to react with the hydrogen there, or, when the media adsorb at the surface, to be able to reduce the discharge energy of the hydrogen dissolved in the solid. Of course, any combinations of the stated conditioning steps may be used to efficiently expel the harmful $H_2$-containing gas.

Due to the described targeted exchange of the gas in the acceleration sensor cavity with a "harmless" gas, it is no longer possible for light gases such as $H_2$ to diffuse from one cavity to the other. Malfunctions of the rotation rate sensor over its service life may be avoided in this way.

Figure 7:
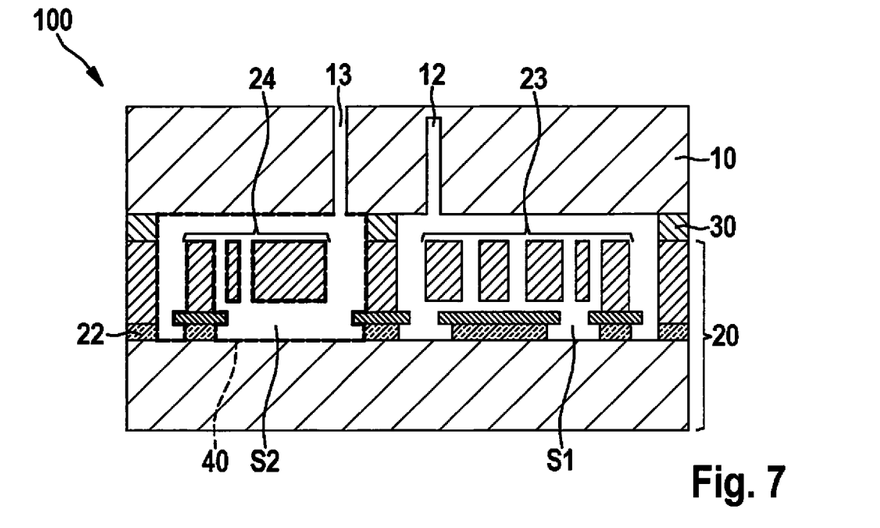

In the cross-sectional view of micromechanical component 100 in FIG. 7, it is apparent that an anti-stick layer 40 has been introduced into the cavity of second sensor S2 through second access hole 13, the anti-stick layer being applied to the surfaces of the cavity, in particular to structures 24. A suitable internal pressure is also set in the cavity of second sensor S2 before second access hole 13 is closed.

As a result, the anti-stick layer is introduced into one of the sensor cavities subsequent to the bonding process, as the result of which the material properties of the anti-stick layer are largely maintained, also after the bonding process. Laborious removal of the anti-stick layer from locations where it is not wanted is thus advantageously not necessary.

The wafer bonding advantageously takes place in this way, even without an anti-stick layer. It is known that ASC molecules on the bonding frame may have a very adverse effect on the bonding behavior, for example with eutectic Al—Ge bonds. For this reason, it has traditionally been necessary to selectively remove the ASC layer on the bonding frame from the bonding frame with the aid of special cleaning or bake-out steps. This need is advantageously dispensed with by use of the provided method, so that bond adhesion may be improved compared to the situation with ASC deposition prior to the wafer bonding. The anti-stick layer of the acceleration sensor is not degraded by the high-temperature step of the closure process (wafer bonding, for example), since it is not applied until after this step. The anti-stick properties of the anti-stick layer are therefore fully retained.

Figure 8:
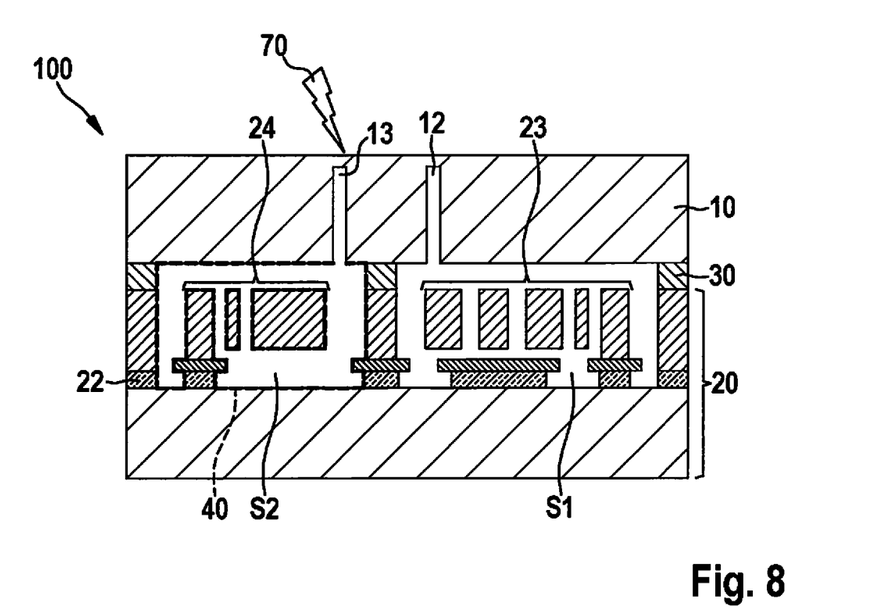

It is apparent from the cross-sectional view of micromechanical component 100 in FIG. 8 that the cavity of second sensor S2 has been reclosed via second access hole 13, which may be by laser closure with the aid of laser 70. Alternatively, a film deposition process (not illustrated) may also be used for the closure.

As a result, the configuration in FIG. 8 represents a micromechanical component 100 that includes two separate cavities having different internal pressures, an anti-stick layer 40 being situated in one of the cavities.

It is also advantageously possible with the described method to provide access to a cavity of a third sensor, and optionally even further sensors, of the micromechanical component, and to close the cavity at defined pressures (not illustrated).

Figure 9:
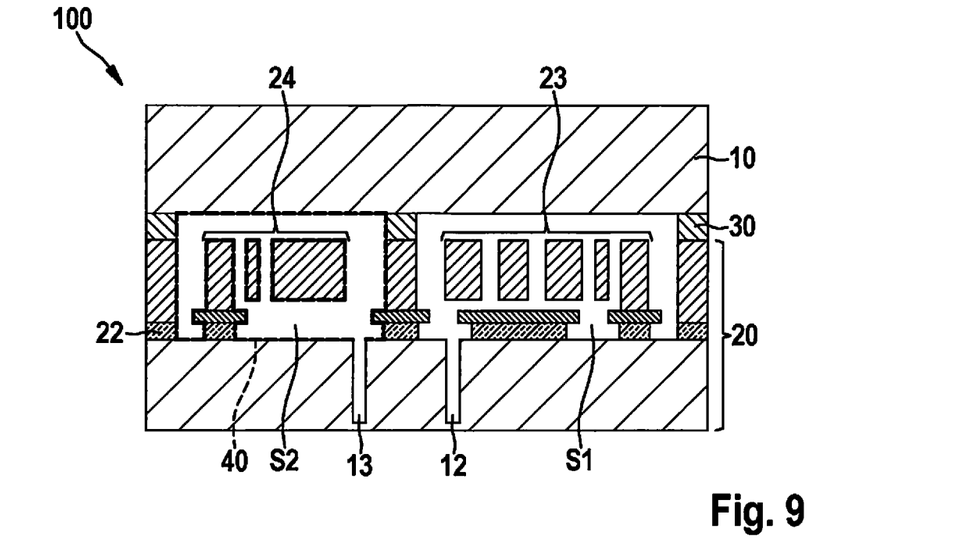
FIG. 9 shows a cross-sectional view of a micromechanical component, with an alternative design of the access holes.

The cross-sectional view in FIG. 9 shows one alternative specific embodiment of a micromechanical component 100. It is apparent that in this variant, access holes 12, 13 are guided from below through the substrate of MEMS wafer 20. This advantageously results in an alternative opening and closing option for the sensor cavities.

All of the opening and closing steps mentioned above may be carried out with the aid of laser machining, since the associated process steps are very quick and therefore cost-effective.

Figure 10:
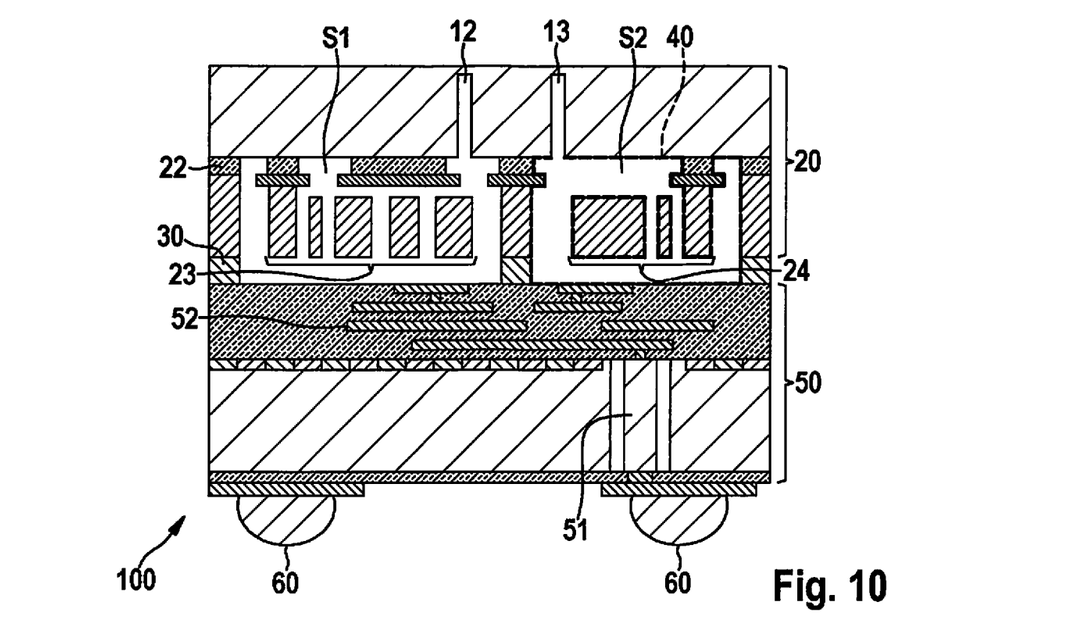
FIG. 10 shows a micromechanical component that is manufactured by the provided method, with an alternative shape of a cap wafer.

FIG. 10 shows a cross-sectional view of another specific embodiment of a micromechanical component 100. In this variant, an ASIC wafer 50 is used instead of a cap wafer 10, thus advantageously providing an alternative option for closing MEMS wafer 20. ASIC wafer 50 may be configured as a CMOS-ASIC wafer having an electronic circuit structure 52 in the form of evaluation circuits, digital circuits, memories, interfaces, etc., in the transistor level. A compact design of micromechanical component 100 is facilitated in this way. The present invention is particularly advantageous in this case, since the design of ASIC wafer 50 includes no deep cap cavities, thus allowing only a small cavity volume. An electrical through-silicon via (TSV) 51 is apparent, with which an electrical contact with circuit structure 52 is establishable within ASIC wafer 50.

Figure 11:
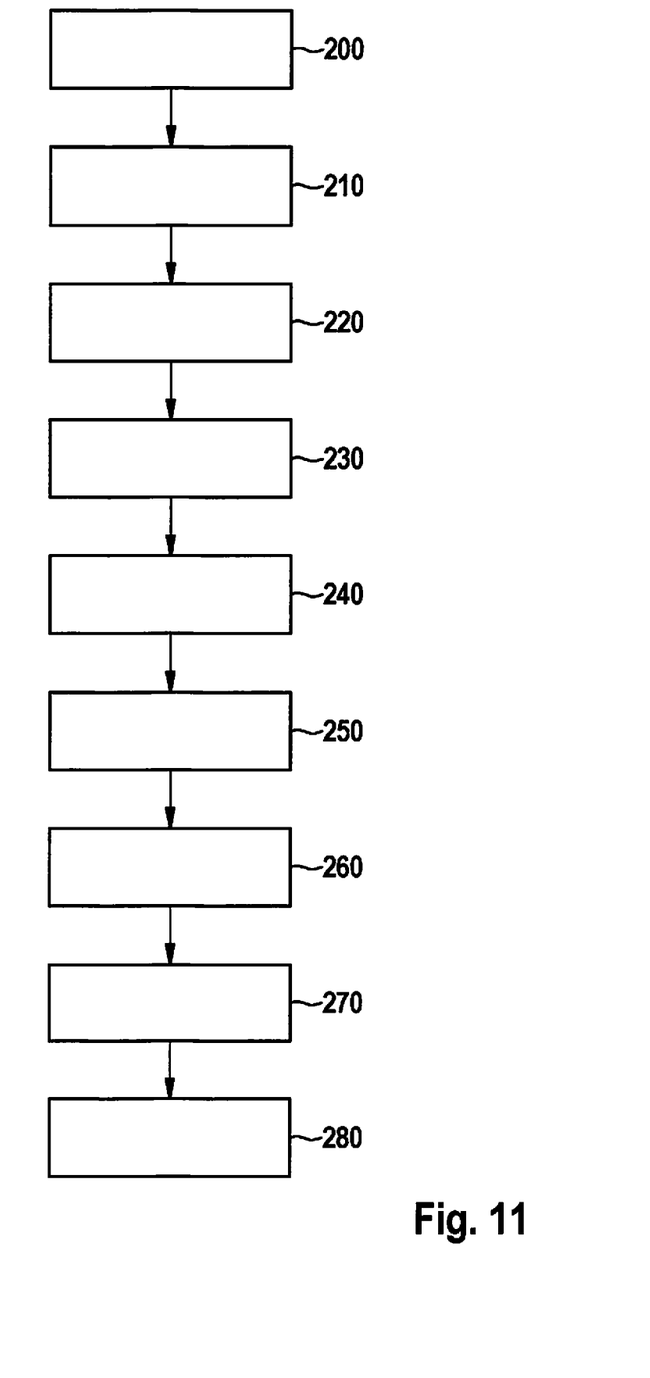
FIG. 11 shows a schematic flow chart of one specific embodiment of the provided method.

FIG. 11 shows a schematic flow chart of a sequence of the provided method.

A MEMS wafer 20 and a cap wafer 10 are provided in a step 200.

Micromechanical structures 23, 24 are formed in the MEMS wafer 20 for at least two sensors S1, S2 in a step 210.

MEMS wafer 20 is hermetically sealed with cap wafer 10 in a step 220.

A first access hole 12 is formed in a first cavity of a first sensor S1 in a step 230.

A defined first pressure is introduced into the cavity of first sensor S1 via first access hole 12 in a step 240.

First access hole 12 is closed in a step 250.

A second access hole 13 is formed in a second cavity of a second sensor S2 in a step 260.

A defined second pressure is introduced into the cavity of second sensor S2 via second access hole 13 in a step 270.

Second access hole 13 is closed in a step 280.

The sequence of opening and closing the cavities of sensors S1 and S2 is advantageously freely selectable.

In the provided method, the wafer bonding or the hermetic sealing of the MEMS wafer with the cap wafer may advantageously take place at an arbitrary internal pressure, since both cavities are subsequently reopened anyway and adjusted with regard to the internal pressure. This is advantageous for providing a particularly homogeneous temperature distribution during the wafer bonding.

As a result, the internal pressure of the rotation rate sensor cannot be adversely affected by ASC molecules, and may therefore be set very low.

When closure is carried out with the laser, the type of gas and the internal pressure in the acceleration sensor cavity may be flexibly selected and adapted to the particular application requirements.

In summary, the present invention provides a method for manufacturing a MEMS component that includes two cavities having different internal pressures, in which a first cavity of a first sensor may be closed at a defined first internal pressure, and in which a second cavity of a second sensor may be closed at a defined second internal pressure. The closure of the two access holes of the two cavities takes place sequentially, so that support is advantageously provided which allows defined processing of the cavities of the two sensors.

Although the present invention has been described above with reference to specific exemplary embodiments, those skilled in the art may also implement specific embodiments of the present invention that are not disclosed or only partly disclosed above, without departing from the core of the present invention.

What is claimed is:

1. A method for manufacturing a micromechanical component, the method comprising:
   providing a MEMS wafer and a cap wafer;
   forming micromechanical structures in the MEMS wafer for at least two sensors;
   hermetically sealing the MEMS wafer with the cap wafer;
   forming a first access hole in a first cavity of a first sensor;
   introducing a defined first pressure into the cavity of the first sensor via the first access hole;
   closing the first access hole;
   forming a second access hole in a second cavity of a second sensor;
   introducing a defined second pressure into the cavity of the second sensor via the second access hole; and
   closing the second access hole.

2. The method of claim 1, wherein after the MEMS wafer is joined to the cap wafer, $H_2$-containing gas is removed from the cavity of the second sensor and a defined gas is filled into the cavity of the second sensor.

3. The method of claim 2, wherein after the hydrogen is removed from the cavity of the second sensor, oxygen and/or ozone and/or a defined plasma is/are filled into the cavity of the second sensor.

4. The method of claim 3, wherein in the case of infilling of multiple media, sequential infilling of each medium is carried out.

5. The method of claim 1, wherein an anti-stick layer is filled into the cavity of the second sensor.

6. The method of claim 1, wherein the closing of the MEMS wafer with the cap wafer is carried out with the aid of a wafer bonding process or with the aid of a thin film cap.

7. The method of claim 1, wherein the formation of at least one of the access holes is carried out with the aid of a laser.

8. The method of claim 1, wherein the formation of at least one of the access holes is carried out with the aid of a trenching process.

9. The method of claim 1, wherein the closing of at least one of the access holes is carried out with the aid of the laser.

10. The method of claim 1, wherein the closing of at least one of the access holes is carried out with the aid of a deposition process.

11. The method of claim 1, wherein at least one of the access holes is formed in the MEMS wafer or in the cap wafer.

12. The method of claim 1, wherein an ASIC wafer is used as the cap wafer.

13. The method of claim 1, wherein structures for a third sensor are formed in the MEMS wafer.

14. A method for manufacturing a micromechanical component, the method comprising:
    providing a MEMS wafer and a cap wafer;
    forming at least one first micromechanical structure and at least one second micromechanical structure;
    bonding the MEMS wafer with the cap wafer, thereby forming a first hermetically sealed cavity in which the at least one first micromechanical structure is located and a second hermetically sealed cavity in which the at least one second micromechanical structure is located;
    forming an access hole in the first cavity;
    introducing a defined first pressure into the first cavity via the access hole in the first cavity;
    subsequent to the introduction of the defined first pressure into the first cavity closing the access hole in the first cavity;
    subsequent to the closing of the access hole in the first cavity, forming an access hole in the second cavity;
    introducing a defined second pressure into the second cavity via the access hole in the second cavity; and
    subsequent to the introduction of the defined second pressure in the second cavity, closing the second access hole in the second cavity.

15. The method of claim 14, further comprising depositing an anti-stiction coating into one of the first and second cavities via its respective access hole prior to the closing of the respective access hole.

16. A micromechanical component comprising:
    a MEMS wafer; and
    a cap wafer;
    wherein:
        the MEMS wafer and the cap wafer are joined with a bond connection;
        first and second sensors are each arranged in respective cavities (a) that are hermetically sealed within the bonded wafers and (b) within which there are respective internal pressures that differ from each other; and
        hydrogen is removed from the cavity of the second sensor and a defined gas is filled in the cavity of the second sensor.

* * * * *